Dec. 9, 1958 R. B. HAMILTON 2,863,957
TRIAD TRANSISTOR AMPLIFIER
Filed March 10, 1958
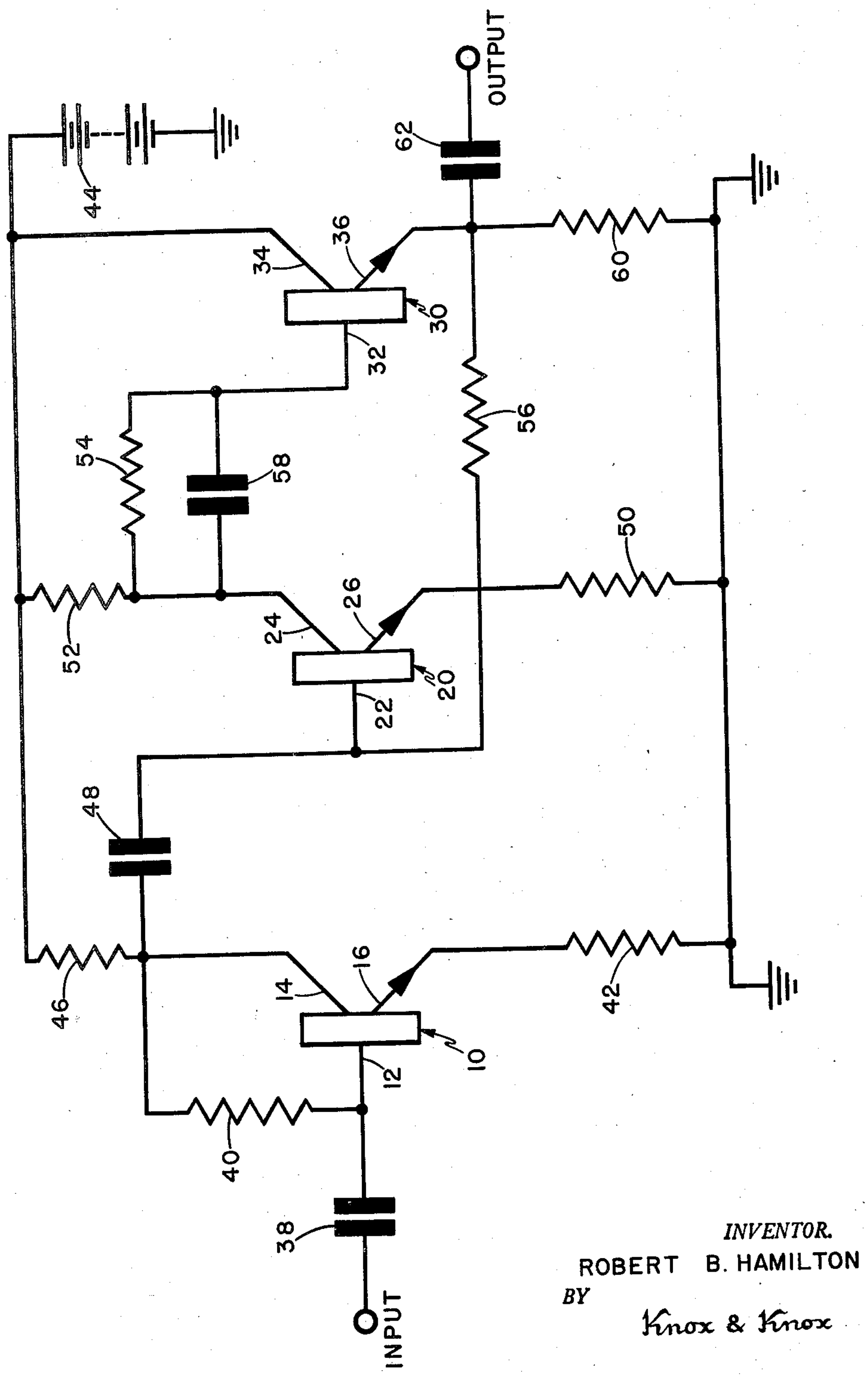
INVENTOR.
ROBERT B. HAMILTON
BY
Knox & Knox United States Patent Office 2,863,957

Patented Dec. 9, 1958

2,863,957

TRIAD TRANSISTOR AMPLIFIER

Robert B. Hamilton, La Mesa, Calif., assignor to Ryan Aeronautical Co., San Diego, Calif.

Application March 10, 1958, Serial No. 720,328

6 Claims. (Cl. 179—171)

The present invention relates generally to amplifiers and more particularly to a triad transistor amplifier.

The primary object of this invention is to provide an amplifier utilizing three transistors in a novel circuit in which the first transistor is stabilized by means of both shunt and series feedback, while the second and third transistors are coupled in a D. C. loop with the base current of the second supplied from the emitter voltage of the third and the base current of the third supplied from the collector voltage of the second, so that each is stabilized by the other.

Another object of this invention is to provide a transistor amplifier in which the variation effects of transistor parameters are minimized over a wide range.

Another object of this invention is to provide a transistor amplifier in which temperature variations are compensated for by means of a negative coefficient resistor in series with a portion of the feedback circuit.

Finally, it is an object to provide a transistor amplifier of the aforementioned character which is simple to assemble and use and which will give generally efficient and durable service.

With these and other objects definitely in view, this invention consists in the novel construction, combination and arrangement of elements and portions, as will be hereinafter fully described in the specification, particularly pointed out in the claims, and illustrated in the drawing which forms a material part of this disclosure, and in which the only figure is a schematic wiring diagram of the amplifier.

Referring now to the details of the circuit, the amplifier has three transistors, namely, a first transistor 10 having a base electrode 12, collector electrode 14 and emitter electrode 16, a second transistor 20 having a base electrode 22, collector electrode 24 and emitter electrode 26, and a third transistor 30 having a base electrode 32, collector electrode 34 and emitter electrode 36. The input voltage is fed into the base 12 of transistor 10 through a blocking capacitor 38 which prevents leakage of the D. C. bias back to ground and also serves as an A. C. coupling capacitor. The transistor 10 has a shunt feedback from collector 14 to base 12 through a bias resistor 40 and has a series feedback from emitter 16, through resistor 42 to ground. D. C. bias voltage is fed from the positive side of a battery 44, through a load resistor 46, to the collector 14, the other side of the battery being connected to ground. The collector 14 is connected to the base 22 of transistor 20 through a coupling capacitor 48 which prevents A. C. loss, while the emitter 26 is connected to a temperature sensitive resistor 50 and thence to ground. Voltage from the battery 44 is fed to the collector 24 through a collector load resistor 52. Transistors 20 and 30 are coupled in a D. C. loop which stabilizes the output of the amplifier over a wide range of transistor parameter variations. To accomplish this, the collector 24 of transistor 20 is connected through a coupling resistor 54 to the base 32 of transistor 30, through a feedback control resistor 56, back to the base 22. An A. C. bypass capacitor 58 is also connected between the collector 24 and base 32 in parallel with the resistor 54.

D. C. voltage is fed to the collector 34 from battery 44 and the emitter 36 is connected to ground through an output impedance resistor 60. The output voltage is taken from the emitter 36 through a coupling capacitor 62.

In operation of the amplifier, the stabilization of the first transistor 10 by means of shunt and series feedbacks is substantially conventional and well known in the art. The series feedback resistor 42 also serves to raise the input impedance so that the amplifier may be effectively cascaded if necessary. The input is fed to the base 22 of the second transistor 20 and the resultant voltage at the collector 24 is coupled to the base 32 of the third transistor 30 through the D. C. coupling resistor 54 and D. C. bypass capacitor 58. Thus any variation in the input at base 22 causes a proportionate variation at the base 32 which, in turn, causes a variation at the emitter 36. This last variation is fed back to the base 22 and tends to change the voltage level at said base to the level prior to the initial variation. In this manner, the transistors 20 and 30 effectively stabilize each other and minimize the variation effects of transistor parameters arising from manufacturing inconsistencies, radiation effects and temperature variations due to changing operating conditions, the last being further compensated for by means of the temperature sensitive resistor 50 which is of the negative coefficient type, that is, a resistor which has a decreasing ohmic value for an increasing operating temperature, providing an increase in gain with an increase in temperature.

The stabilization for temperature variations is accomplished as follows: since the feedback resistor 56, transistor 20 and resistor 50 are in series and the resistor 50 controls the input impedance of said transistor 20, any variation in the resistance value of resistor 50 due to temperature change causing a corresponding change in the transistor's input impedance and also adjusting the feedback by division of the feedback ratio through resistor 56. Similar compensation for certain frequency ranges may be obtained by substituting a conventional resistor-capacitor network for the resistor 50.

The amplifier is therefore characterized by the inherent stability of the closed loop circuit in which two transistors stabilize each other and minimize the effects of variable parameters, and the temperature stabilization obtained by the closed loop circuit and the temperature sensitive resistor used in conjunction therewith. The amplifier has a moderately high input impedance and a low output impedance and is thus suitable for cascading, with negligible loading effect, to obtain very high amplification.

The operation of this invention will be clearly comprehended from a consideration of the foregoing description of the mechanical details thereof, taken in connection with the drawing and the above recited objects. It will be obvious that all said objects are amply achieved by this invention.

It is understood that minor variation from the form of the invention disclosed herein may be made without departure from the spirit and scope of the invention, and that the specification and drawing are to be considered as merely illustrative rather than limiting.

I claim:

1. In a transistor amplifier: a first transistor, a second transistor and a third transistor, each of said transistors having a base electrode, a collector electrode and an emitter electrode; a source of input voltage connected to said first transistor base electrode; bias voltage means connected to each of said collector electrodes; coupling means connecting said first transistor collector electrode to said second transistor base electrode; a closed loop interconnecting said second and third transistors and including a D. C. and A. C. coupling means connecting said second transistor collector electrode to said third transistor base electrode, and D. C. and A. C. feedback means connecting said third transistor emitter electrode to said second transistor base electrode; said first and second transistor emitter electrodes being connected to a common ground; and an output circuit connected to said third transistor emitter electrode; whereby the amplifier is stabilized since voltage variations at said second transistor base electrode cause proportional voltage variations at said third transistor emitter electrode and are fed back to said second transistor base electrode to nullify the initial voltage variations.

2. In a transistor amplifier: a first transistor, a second transistor and a third transistor, each of said transistors having a base electrode, a collector electrode and an emitter electrode; a source of input voltage connected to said first transistor base electrode; bias voltage means connected to each of said collector electrodes; coupling means connecting said first transistor collector electrode to said second transistor base electrode; a closed loop interconnecting said second and third transistors and including a D. C. and A. C. coupling means connecting said second transistor collector electrode to said third transistor base electrode, and D. C. and A. C. feedback means connecting said third transistor emitter electrode to said second transistor base electrode; said first and second transistor emitter electrodes being connected to a common ground; and an output circuit connected to said third transistor emitter electrode; whereby the amplifier is stabilized since voltage variations at said second transistor base electrode cause proportional voltage variations at said third transistor emitter electrode and are fed back to said second transistor base electrode to nullify the initial voltage variations; and means for proportionately adjusting the input impedance of said second transistor.

3. In a transistor amplifier: a first transistor, a second transistor and a third transistor, each of said transistors having a base electrode, a collector electrode and an emitter electrode; a source of input voltage connected to said first transistor base electrode; bias voltage means connected to each of said collector electrodes; coupling means connecting said first transistor collector electrode to said second transistor base electrode; a closed loop interconnecting said second and third transistors and including a D. C. and A. C. coupling means connecting said second transistor collector electrode to said third transistor base electrode, and D. C. and A. C. feedback means connecting said third transistor emitter electrode to said second transistor base electrode; said first and second transistor emitter electrodes being connected to a common ground; and an output circuit connected to said third transistor emitter electrode; whereby the amplifier is stabilized since voltage variations at said second transistor base electrode cause proportional voltage variations at said third transistor emitter electrode and are fed back to said second transistor base electrode to nullify the initial voltage variations; temperature sensitive means connected between said second transistor emitter electrode and ground and in series with the second transistor and said feedback means to proportionately adjust the input impedance of said second transistor to compensate for temperature variations.

4. In a transistor amplifier: a first transistor, a second transistor and a third transistor, each of said transistors having a base electrode, a collector electrode and an emitter electrode; a source of input voltage connected to said first transistor base electrode; bias voltage means connected to each of said collector electrodes; coupling means connecting said first transistor collector electrode to said second transistor base electrode; a closed loop interconnecting said second and third transistors and including a coupling resistor connected between said second transistor collector electrode and said third transistor base electrode, an A. C. bypass capacitor connected in parallel with said coupling resistor, and a feedback control resistor connected between said third transistor emitter electrode and said second transistor base electrode, said first and second transistor emitter electrodes being connected to a common ground; and an output circuit connected to said third transistor emitter electrode; whereby the amplifier is stabilized since voltage variations of said second transistor base electrode cause proportional voltage variations at said third transistor emitter electrode and are fed back to said third transistor emitter electrode and are fed back to said second transistor base electrode to nullify the initial voltage variations; and a temperature sensitive, negative coefficient resistor connected between said second transistor emitter electrode and ground and in series with said second transistor and said feedback control resistor, whereby the input impedance of said second transistor and the effective value of said feedback control resistor are varied in inverse proportion to changes in temperature affecting said temperature sensitive resistor.

5. In a transistor amplifier: a first transistor, a second transistor and a third transistor, each of said transistors having a base electrode, a collector electrode and an emitter electrode; a source of input voltage connected to said first transistor base electrode; bias voltage means connected to each of said collector electrodes; coupling means connecting said first transistor collector electrode to said second transistor base electrode; a closed loop interconnecting said second and third transistors and including a coupling resistor connected between said second transistor collector electrode and said third transistor base electrode, an A. C. bypass capacitor connected in parallel with said coupling resistor, and a feedback control resistor connected between said third transistor emitter electrode and said second transistor base electrode, said first and second transistor emitter electrodes being connected to a common ground; and an output circuit connected to said third transistor emitter electrode; whereby the amplifier is stabilized since voltage variations at said second transistor base electrode cause proportional voltage variations at said second transistor base electrode to nullify the initial voltage variations; and means for proportionately adjusting the input impedance of said second transistor to compensate for temperature variations.

6. In a transistor amplifier: a first transistor, a second transistor and a third transistor, each of said transistors having a base electrode, a collector electrode and an emitter electrode; a source of input voltage connected to said first transistor base electrode; bias voltage means connected to each of said collector electrodes; a shunt feed-back circuit connecting said first transistor collector electrode to said first transistor base electrode, and a series feedback circuit connecting said first transistor emitter electrode to ground; coupling means connecting said first transistor collector electrode to said second transistor base electrode; a closed loop interconnecting said second and third transistors and including a D. C. and A. C. coupling means connecting said second transistor collector electrode to said third transistor base electrode, and D. C. and A. C. feedback means connecting said third transistor emitter electrode to said second transistor base electrode; and an output circuit connected to said third transistor emitter electrode; whereby the amplifier is stabilized since voltage variations at said second transistor base electrode cause proportional voltage variations at said third transistor emitter electrode and are fed back to said second transistor base electrode to nullify the initial voltage variations; temperature sensitive means connected between said second transistor emitter electrode and ground and in series with the second transistor and said feedback means to proportionately adjust the input impedance of said second transistor to compensate for temperature variations.

No references cited.